United States Patent
Nishio et al.

(10) Patent No.: US 12,330,233 B2
(45) Date of Patent: Jun. 17, 2025

(54) LASER OUTPUT POWER CONTROL METHOD, AND LASER PROCESSING DEVICE

(71) Applicant: Panasonic Intellectual Property Management Co., Ltd., Osaka (JP)

(72) Inventors: Masatoshi Nishio, Osaka (JP); Manabu Nishihara, Osaka (JP); Takamichi Komatsu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 636 days.

(21) Appl. No.: 17/806,285

(22) Filed: Jun. 10, 2022

(65) Prior Publication Data

US 2022/0297231 A1    Sep. 22, 2022

Related U.S. Application Data

(63) Continuation of application No. PCT/JP2020/048897, filed on Dec. 25, 2020.

(30) Foreign Application Priority Data

Jan. 9, 2020 (JP) ................................ 2020-001981

(51) Int. Cl.
*B23K 26/06* (2014.01)
*B23K 26/70* (2014.01)
(Continued)

(52) U.S. Cl.
CPC ........ *B23K 26/0626* (2013.01); *B23K 26/705* (2015.10); *H01S 5/062* (2013.01);
(Continued)

(58) Field of Classification Search
CPC .... B23K 15/0013; B23K 15/02; B23K 15/08; B23K 15/085; B23K 2103/42; B23K 2103/52; B23K 37/003; B23K 9/0956
(Continued)

(56) References Cited

U.S. PATENT DOCUMENTS 5,142,094 A     8/1992 O'Brien et al.
5,961,857 A  * 10/1999 Takahashi ............... H01S 3/104
                                                                219/121.62
(Continued)

FOREIGN PATENT DOCUMENTS

JP     3-218345      9/1991
JP     2003-053564   2/2003
(Continued)

OTHER PUBLICATIONS

WO-2019220832-A1 English translation (Year: 2019).*
(Continued)

*Primary Examiner* — Chris Q Liu
(74) *Attorney, Agent, or Firm* — Wenderoth, Lind & Ponack, L.L.P.

(57) ABSTRACT

The control unit executes: a first execution step of executing a processing program to set a target value to a value defined by a processing program and performing feedback control on a driving current of a laser oscillator; a detection step of detecting an output fluctuation during execution of the first execution step; a specification step of specifying a physical quantity for which a measured value within a predetermined monitoring time before an occurrence timing of the output fluctuation does not satisfy a predetermined condition as an abnormal physical quantity from a plurality of physical quantities measured during execution of the first execution step; and a program update step of detecting appearance of a predetermined feature in an abnormal physical quantity as
(Continued)

a fluctuation factor during execution of a post-update processing program, and updating the processing program to correct the driving current to reduce a difference between the laser output power and the target value compared with when the output fluctuation occurs in the first execution step after detection of the fluctuation factor.

5 Claims, 7 Drawing Sheets

(51) Int. Cl.
*H01S 5/062* (2006.01)
*H01S 5/068* (2006.01)
*H01S 5/0683* (2006.01)
*H01S 5/40* (2006.01)

(52) U.S. Cl.
CPC ........ *H01S 5/06804* (2013.01); *H01S 5/0683* (2013.01); *H01S 5/4025* (2013.01)

(58) Field of Classification Search
USPC ........... 219/121.62, 121, 11, 121.13, 121.14, 219/121.61, 121.63, 121.64, 121.68, 219/121.82, 121.83, 124.1
See application file for complete search history.

(56) References Cited

U.S. PATENT DOCUMENTS

| | | | |
|---|---|---|---|
| 6,818,856 B2* | 11/2004 | Yamazaki | B23K 26/702 219/121.62 |
| 2004/0161011 A1* | 8/2004 | Tsunekane | H01S 5/4025 372/50.1 |
| 2019/0131770 A1* | 5/2019 | Ikedo | H01S 5/0421 |
| 2019/0351507 A1* | 11/2019 | Ryudo | B23K 26/043 |
| 2019/0353857 A1* | 11/2019 | Ishikawa | G02B 6/4204 |
| 2020/0006921 A1* | 1/2020 | Ikedo | B23K 26/21 |
| 2020/0083665 A1* | 3/2020 | Mochiyama | H01S 5/4031 |
| 2020/0328577 A1* | 10/2020 | Enzmann | H01S 5/042 |
| 2021/0044081 A1* | 2/2021 | Shibagaki | H01S 5/042 |

FOREIGN PATENT DOCUMENTS

| | | | |
|---|---|---|---|
| JP | 2004-253525 | 9/2004 | |
| JP | 2005-209759 | 8/2005 | |
| WO | WO-2015118829 A1 * | 8/2015 | .......... B23K 26/064 |
| WO | WO-2019181114 A1 * | 9/2019 | |

OTHER PUBLICATIONS

WO-2015118829-A1 English translation (Year: 2015).*
International Search Report of PCT application No. PCT/JP2020/048897 dated Mar. 16, 2021.

* cited by examiner

LASER OUTPUT POWER CONTROL METHOD, AND LASER PROCESSING DEVICE

This application is a continuation of the PCT International Application No. PCT/JP2020/048897 filed on Dec. 25, 2020, which claim the benefit of foreign priority of Japanese patent application No. 2020-001981 filed on Jan. 9, 2020, the contents all of which are incorporated herein by reference.

TECHNICAL FIELD

The present disclosure relates to a laser output power control method and a laser processing device that control a driving current to be supplied to a laser oscillator so as to bring a laser output power of a laser beam emitted by the laser oscillator close to a target value.

BACKGROUND ART

Patent Literature 1 discloses a laser processing device including a laser oscillator, an output measurement unit that measures the laser output power of a laser beam emitted by the laser oscillator, and a control unit that controls an operation signal of the laser oscillator based on a measured value of the output measurement unit so as to bring the laser output power close to a target value.

CITATION LIST

Patent Literature

PTL 1: Unexamined Japanese Patent Publication No. 2003-53564

SUMMARY OF THE INVENTION

Technical Problem

Meanwhile, in the case of performing feedback control as in PTL 1, the state of the laser processing device, for example, the temperature or humidity inside the device changes in a period from the measurement by the output measurement unit to when the measured value is reflected in the laser output power, and an output fluctuation (spike) in which the difference between the laser output power and the target value instantaneously increases may occur. In addition, such an output fluctuation causes a decrease in processing accuracy.

The present disclosure has been made in view of such a point, and an object thereof is to suppress a decrease in processing accuracy due to output fluctuation.

Solution to Problem

In order to achieve the above object, the present disclosure provides a laser processing device including a laser oscillator, an output measurement unit that measures a light amount of a laser beam emitted by the laser oscillator, and a control unit that performs feedback control on a driving current to be supplied to the laser oscillator based on a measured value of the output measurement unit to bring a laser output power of the laser beam close to a target value, the laser processing device executing: a first execution process that is a laser output power control process executed by the control unit and is of executing a pre-update program to set the target value to a value defined by the pre-update program and performing the feedback control; a detection process of detecting an output fluctuation in which a difference between the laser output power and the target value during execution of the first execution process exceeds a predetermined threshold; a specification process of specifying a physical quantity for which a measured value within a predetermined monitoring time before an occurrence timing of the output fluctuation detected in the detection process does not satisfy a predetermined condition as an abnormal physical quantity from a plurality of physical quantities measured in the laser processing device during execution of the first execution process; and a program update process of detecting appearance of a predetermined feature in the abnormal physical quantity specified in the specification process as a fluctuation factor during execution of a post-update program, and updating the pre-update program to the post-update program to perform, after detection of the fluctuation factor, at least one of a correction process of correcting the driving current to reduce a difference between the laser output power and the target value as compared with when the output fluctuation occurs in the first execution process or a warning process of causing an output device to output a warning.

As a result, after a fluctuation factor occurs during execution of the post-update program, the difference between the laser output power and the target value is reduced by the correction process as compared with when the output fluctuation occurs in the first execution step, or the user can stop the processing operation according to the warning process, so that it is possible to suppress a decrease in processing accuracy due to the output fluctuation.

Advantageous Effect of Invention

According to the present disclosure, it is possible to suppress a decrease in processing accuracy due to output fluctuation.

Figure 7:
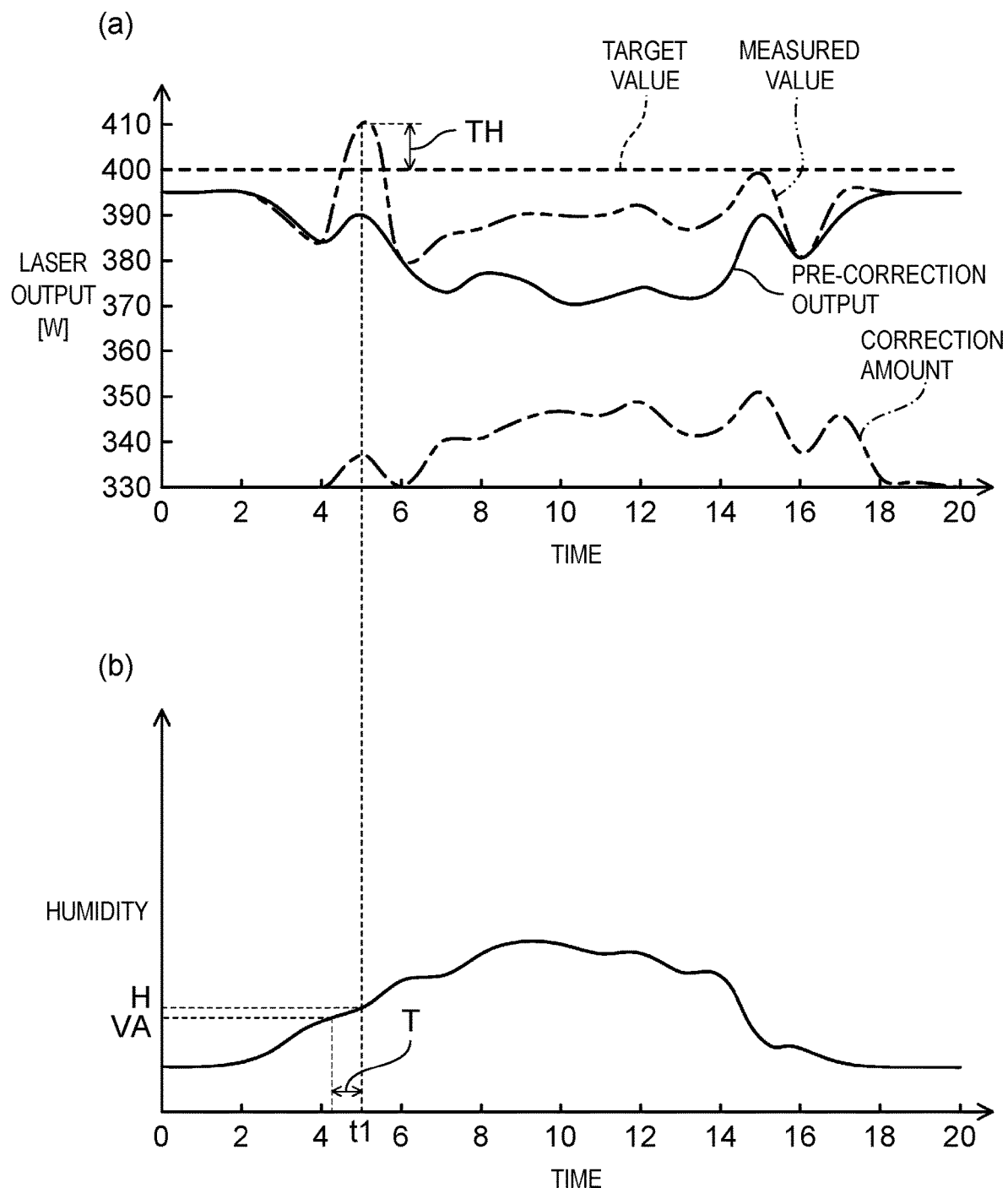

Part (a) of FIG. 7 is a graph illustrating a target value, a measured value, a pre-correction output, and a correction amount of laser output power during execution of a pre-update processing program, and part (b) of FIG. 7 is a graph illustrating a measured value of humidity during execution of the pre-update processing program.

Figure 8:
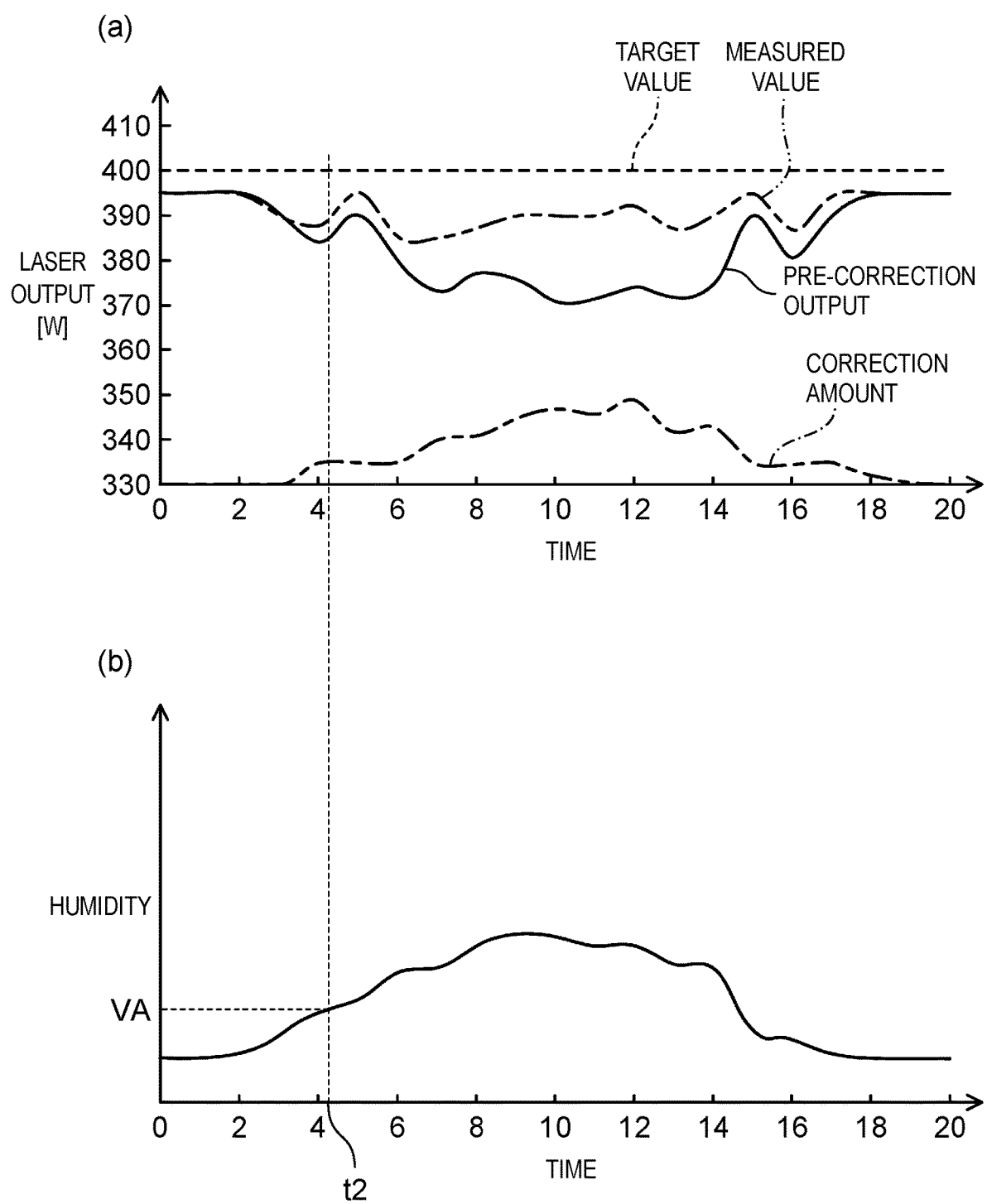

Part (a) of FIG. 8 is a diagram corresponding to part (a) of FIG. 7 during execution of a post-update processing program, and part (b) of FIG. 8 is a diagram corresponding to part (b) of FIG. 7 during execution of the post-update processing program.

DESCRIPTION OF EMBODIMENT

Hereinafter, an exemplary embodiment of the present disclosure will be described in detail with reference to the drawings. The following description of a preferable exemplary embodiment is merely illustrative in nature and is not intended to limit the present disclosure, application thereof, or use thereof.

Figure 1:
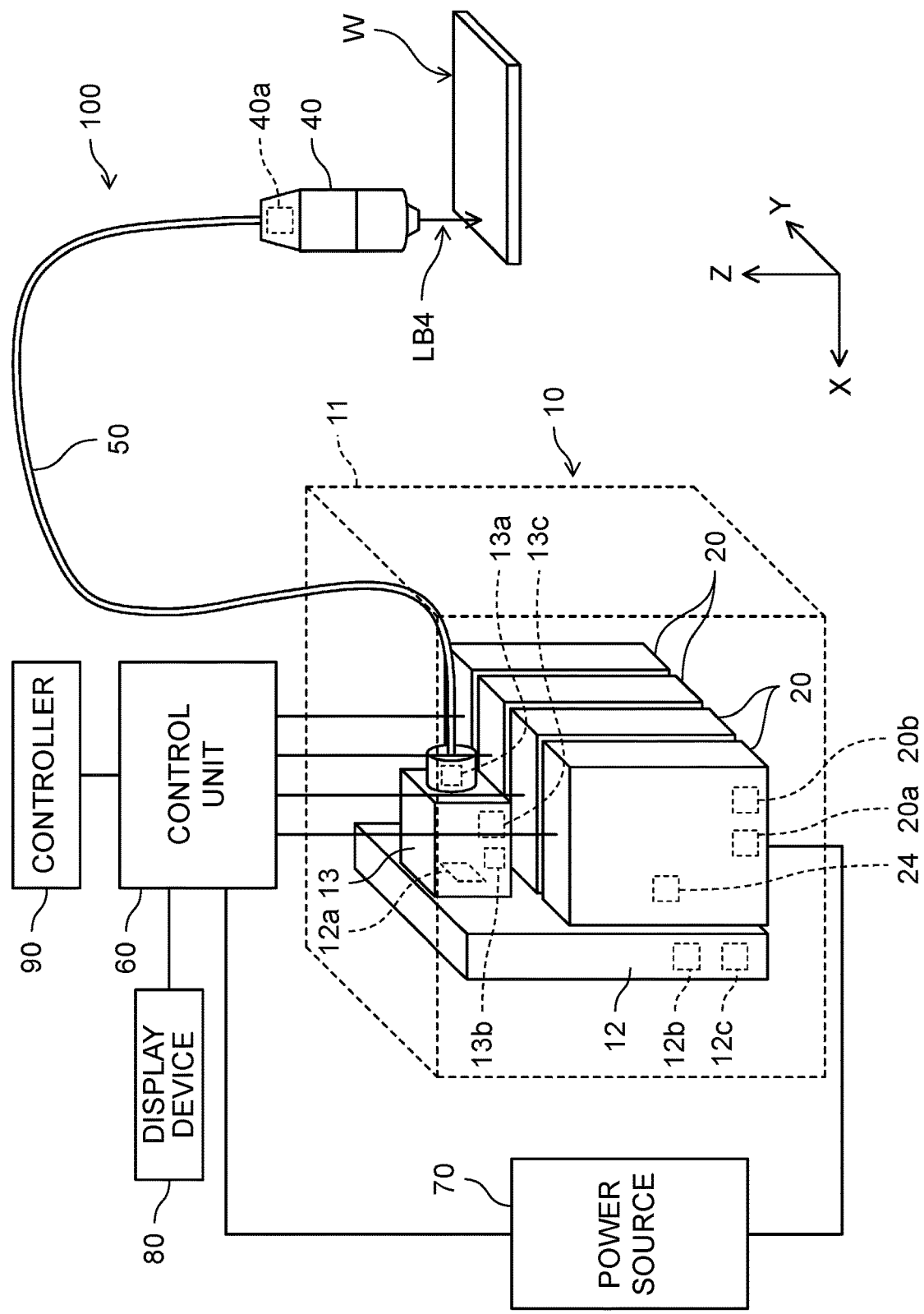
FIG. 1 is a schematic diagram illustrating a configuration of a laser processing device according to a first exemplary embodiment of the present disclosure.

As illustrated in FIG. 1, laser processing device 100 according to the present exemplary embodiment includes laser oscillator 10, laser beam emitting head 40, transmission fiber 50, control unit 60, power source 70, display device 80 as an output device, and controller 90. Laser oscillator 10, and an end portion (incident end) of transmission fiber 50 on the light-condensing unit 13 side are housed in housing 11.

Laser oscillator 10 has a plurality of laser devices 20, beam coupler 12, and light-condensing unit 13.

Figure 2:
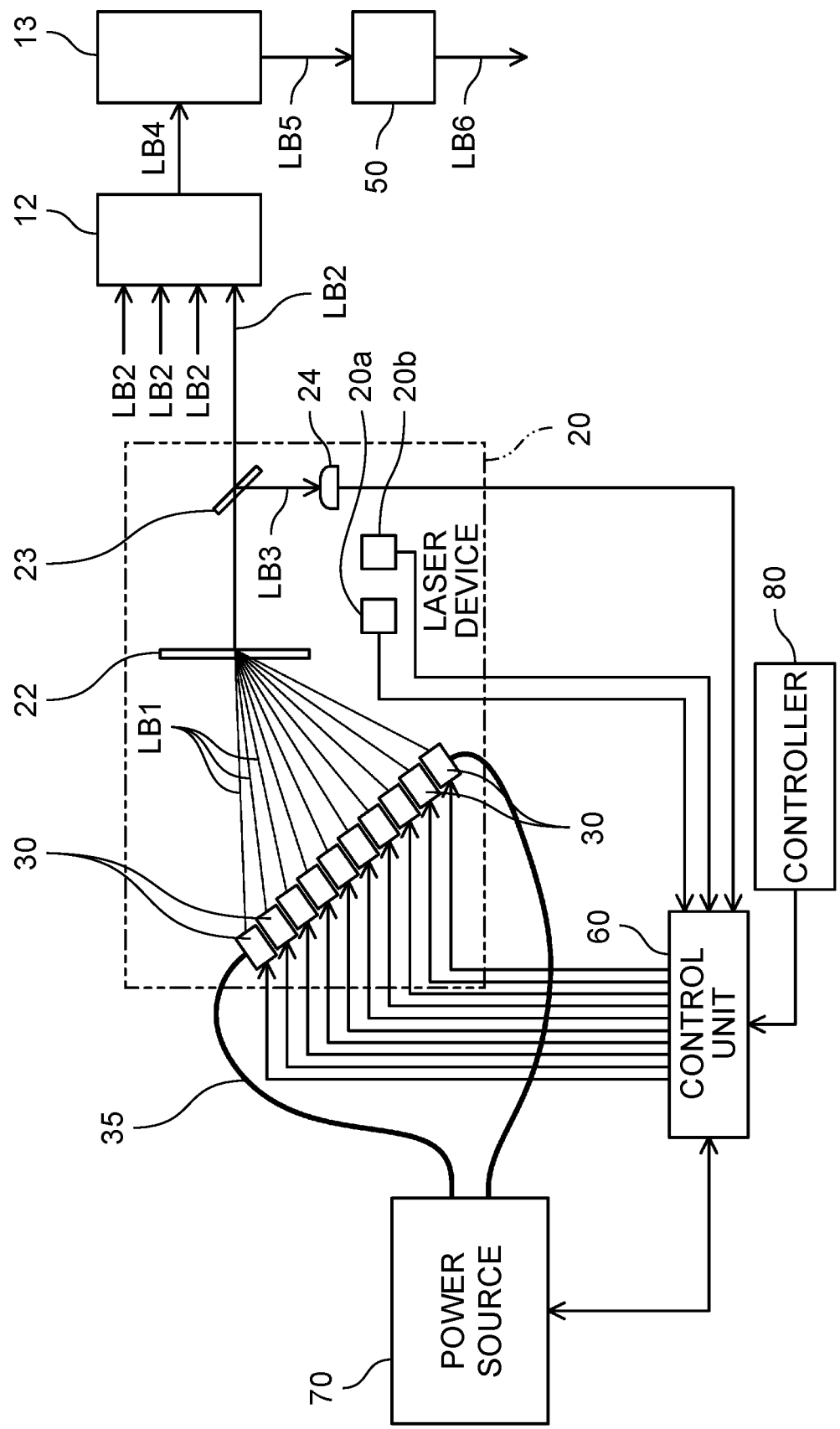
FIG. 2 is a schematic diagram illustrating a configuration of a laser device according to the first exemplary embodiment of the present disclosure.

As illustrated in FIG. 2, laser device 20 has, for example, 10 laser modules 30 that emit laser beams LB1 having wavelengths different from each other, diffraction grating 22 as a laser optical system that couples laser beams LB1 emitted respectively from 10 laser modules 30 and emits a laser beam, partially transmitting mirror 23 that transmits a part of the laser beam emitted by diffraction grating 22 as laser beam LB2 and reflects the rest as reflected light LB3, photodiode 24 that detects reflected light LB3 from partially transmitting mirror 23 and measures the light amount of reflected light LB3, temperature measurement unit 20a that measures the temperature inside laser device 20, and humidity measurement unit 20b that measures the humidity inside laser device 20.

Figure 3:
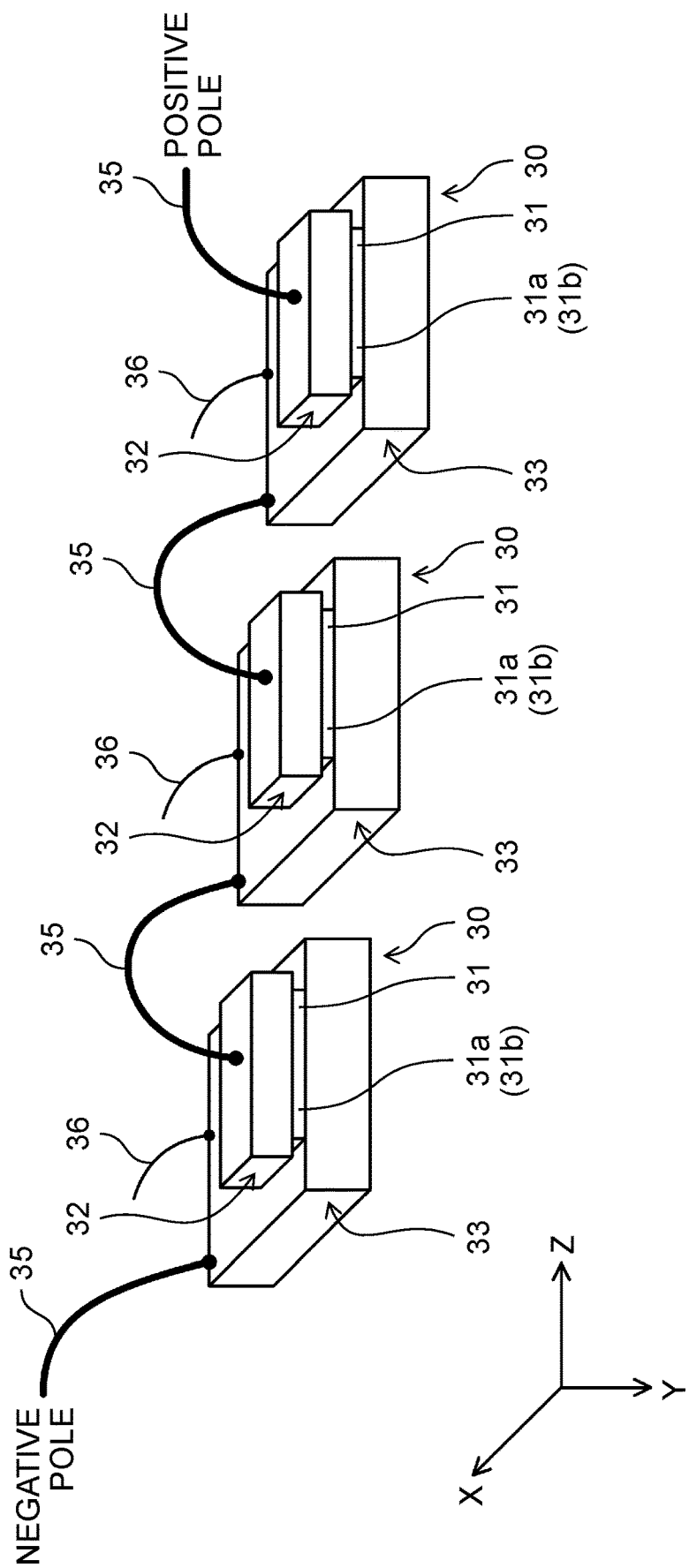
FIG. 3 is a schematic diagram illustrating configurations of a plurality of laser modules.
Figure 4:
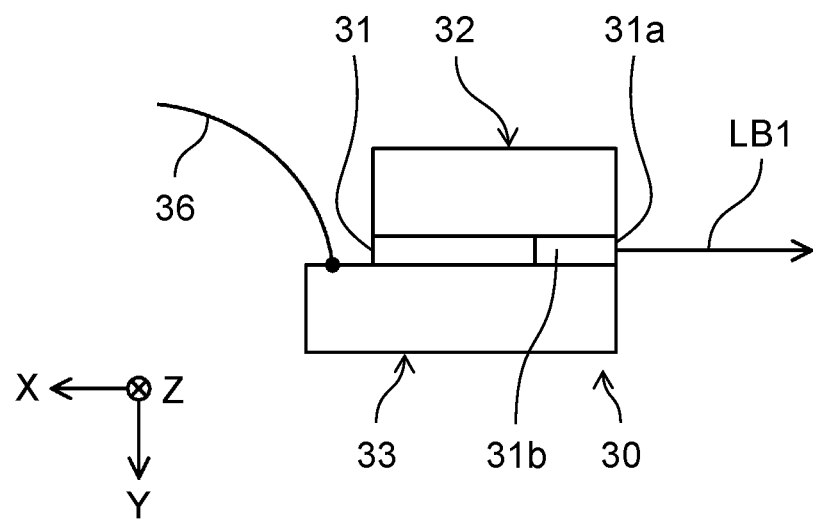
FIG. 4 is a side view of a laser module.
Figure 5:
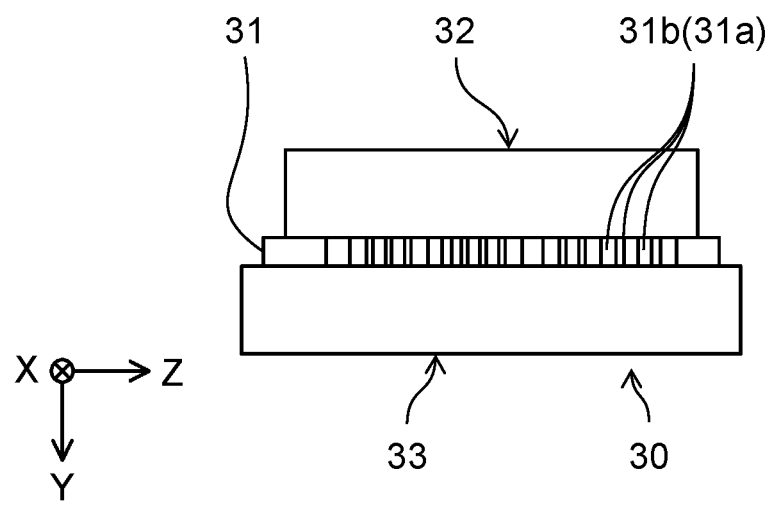
FIG. 5 is a front view of the laser module.

As illustrated in FIGS. 3 to 5, each laser module 30 has laser diode bar (LD bar) 31, and laser diode bar 31 is a semiconductor laser array having a plurality of emitters 31b arranged in parallel. In other words, laser diode bar 31 is a semiconductor laser array including a plurality of laser diodes arranged in parallel, the laser diodes each having emitter 31b. Laser diode bar 31 has a flat plate shape having a rectangular shape in plan view, a plate-shaped positive electrode 32 is disposed on one surface thereof, and the one surface of positive electrode 32 is attached thereto. Moreover, plate-shaped negative electrode 33 wider than positive electrode 32 is disposed on the other surface of laser diode bar 31, and a part of one surface of negative electrode 33 is attached thereto. One side surface of laser diode bar 31 constitutes laser beam emission surface 31a that emits laser beam LB1. Each electrode (positive electrode 32, negative electrode 33) is connected with wire 35, and a current (power) is supplied from power source 70 to be described later via wire 35. Note that the number of emitters 31b included in one laser diode bar 31 is set to, for example, 50. Laser diode bars 31 of 10 laser modules 30 are connected in series with each other.

Thermocouple 36 that measures the temperature in the vicinity of laser diode bar 31 is attached to a region where laser diode bar 31 is not attached in the attachment surface of laser diode bar 31 of negative electrode 33. As means for measuring the temperature in the vicinity of laser diode bar 31, other means such as a resistance temperature detector (RTD), a thermistor, or an integrated circuit (IC) sensor may be used instead of thermocouple 36. Moreover, a semiconductor device such as a thermistor or an IC sensor may be integrally formed with laser diode bar 31, whereby the internal temperature of laser diode bar 31 can be indirectly or directly measured, and the measured temperature can be brought closer to the internal temperature of laser diode bar 31.

Beam coupler 12 couples laser beams LB2 (see FIG. 2) emitted respectively from the plurality of laser devices 20 into one laser beam LB4 and emits laser beam LB4 to light-condensing unit 13. Beam coupler 12 is provided with photodiode 12a that measures a part of the light amount occupying a certain ratio of laser beam LB4, a temperature measurement unit 12b that measures the temperature inside beam coupler 12, and humidity measurement unit 12c that measures the humidity inside beam coupler 12.

Light-condensing unit 13 condenses incident laser beam LB4 by a light-condensing lens (not shown) disposed inside, reduces the beam diameter at a predetermined magnification, and emits the laser beam to transmission fiber 50. In FIG. 2, reference numeral LB5 denotes a laser beam emitted by light-condensing unit 13. Light-condensing unit 13 has a connector (not shown), and the connector is connected with an incident end of transmission fiber 50. Light-condensing unit 13 is provided with photodiode 13a that measures a part of the light amount occupying a certain ratio of laser beam LB5, temperature measurement unit 13b that measures the temperature inside light-condensing unit 13, and humidity measurement unit 13c that measures the humidity inside light-condensing unit 13.

With such a configuration of laser oscillator 10, laser beam LB5 having a high laser output power exceeding several kW can be obtained.

Transmission fiber 50 guides laser beam LB5 emitted from laser oscillator 10 and made incident on the incident end of transmission fiber 50 to laser beam emitting head 40.

Laser beam emitting head 40 emits laser beam LB6 guided by transmission fiber 50 toward the outside. For example, in laser processing device 100 illustrated in FIG. 1, laser beam LB6 is emitted by laser beam emitting head 40 toward workpiece W that is an object to be processed disposed at a predetermined position. In this way, workpiece W is subjected to laser processing. Laser beam emitting head 40 is provided with photodiode 40a as an output measurement unit that measures a part of the light amount occupying a certain ratio of laser beam LB6.

Control unit 60 performs feedback control on the driving current to be supplied to laser oscillator 10 based on the measured value of photodiode 40a so as to bring the laser output power of laser beam LB6 close to a predetermined target value. Here, the control of the driving current by control unit 60 is performed by outputting a command current value to power source 70. Moreover, control unit 60 stores a processing program to be executed when predetermined processing is performed on workpiece W. The processing program defines a target value of the laser output power of laser beam LB6 at each timing during processing. Details of the control by control unit 60 will be described later. Note that control unit 60 causes display device 80 to display timing t2 (see FIG. 8) at which a fluctuation factor to be described later is detected during execution of the processing program, and the correction amount of the command current value immediately after timing t2.

Power source 70 supplies a driving current to each of the plurality of laser devices 20 based on the command current value output by control unit 60.

Display device 80 displays, under the control of control unit 60, timing t2 (see FIG. 8) at which a fluctuation factor is detected during execution of the processing program by control unit 60, and the correction amount of the command current value immediately after timing t2.

Controller 90 accepts an input for modifying the correction amount of the command current value immediately after timing t2 from the user, and outputs a command for instructing modification to control unit 60.

Figure 6:
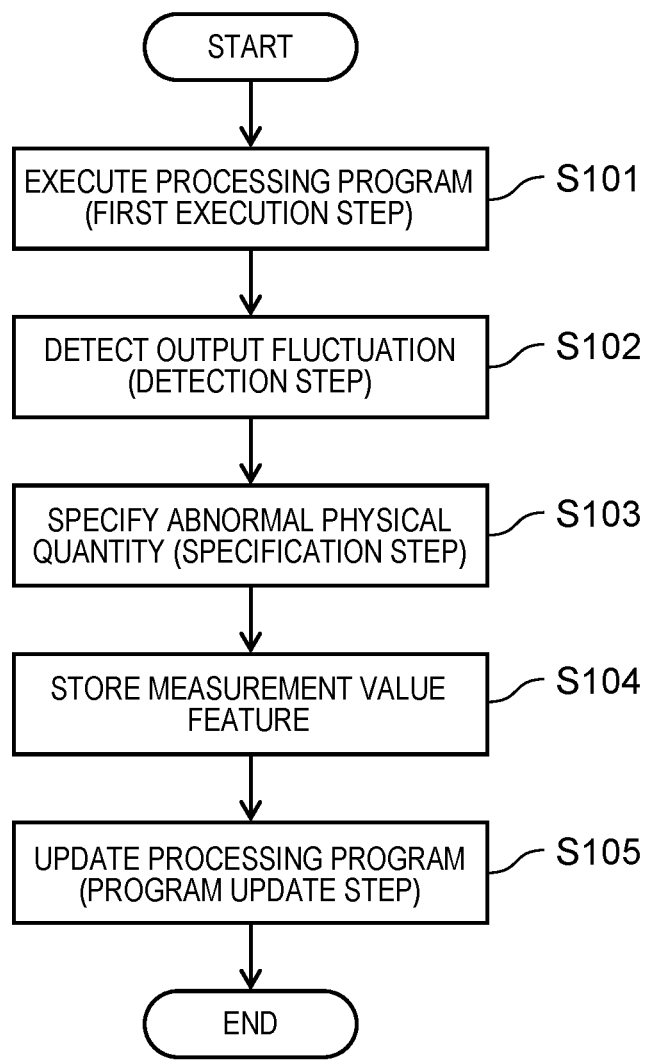
FIG. 6 is a flowchart illustrating an operation of a control unit.

Hereinafter, an operation for controlling the driving current by control unit 60 will be described with reference to FIG. 6.

First, in S101, control unit 60 executes a stored processing program (pre-update program) to perform feedback control on the command current value based on the measured value of photodiode 40*a* so as to bring the laser output power of laser beam LB6 close to the target value at each timing defined in the processing program (first execution step). Control unit 60 stores measured values of photodiodes 12*a*, 13*a*, 24, and 40*a*, temperature measurement units 12*b*, 13*b*, and 20*a*, thermocouple 36, and humidity measurement units 12*c*, 13*c*, and 20*b* as a data log during execution of the processing program. Part (a) of FIG. 7 illustrates the target value of the laser output power of laser beam LB6 during execution of the processing program in S101, the measured value of the laser output power of laser beam LB6 during execution of the processing program in S101, the laser output power (pre-correction output) of laser beam LB6 when the command current value is made constant, and the difference (correction amount) between the measured value of the laser output power of laser beam LB6 during execution of the processing program in S101 and the laser output power of laser beam LB6 when the command current value is made constant. Here, the measured value of the laser output power of laser beam LB6 is calculated by control unit 60 based on the measured value of photodiode 40*a*.

Next, in S102, control unit 60 refers to the data log stored in S101 to detect an output fluctuation in which the difference between the measured value of the laser output power of laser beam LB6 during execution of the processing program in S101 and the target value defined by the processing program exceeds predetermined threshold TH (detection step). Then, output fluctuation occurrence timing t1 (see FIG. 7) at which the output fluctuation is detected is stored.

Next, in S103, control unit 60 specifies a physical quantity for which a measured value within predetermined monitoring time T before output fluctuation occurrence timing t1 does not satisfy a preset predetermined condition as an abnormal physical quantity from a plurality of physical quantities measured in the laser processing device during execution of the processing program in S101 (specification step). The plurality of physical quantities includes measured values of temperature measurement units 12*b*, 13*b*, and 20*a*, thermocouple 36, and humidity measurement units 12*c*, 13*c*, and 20*b*. Moreover, the plurality of physical quantities also includes a loss amount in transmission fiber 50 obtained by subtracting the light amount of laser beam LB6 specified based on the measured value of photodiode 40*a* from the light amount of laser beam LB5 specified based on the measured value of photodiode 13*a*. Specifically, in a case where the humidity measured by humidity measurement unit 20*b* within monitoring time T does not fall within the numerical range of 0% to H %, the humidity is specified as an abnormal physical quantity. In the example in FIG. 7, since the humidity exceeds H within monitoring time T, the humidity is specified as an abnormal physical quantity. Moreover, in a case where the loss amount in transmission fiber 50 obtained by subtracting the light amount of laser beam LB6 from the light amount of laser beam LB5 does not fall within a predetermined numerical range, the loss amount is specified as an abnormal physical quantity.

Next, in S104, control unit 60 stores the feature of the measured value within monitoring time T of the abnormal physical quantity specified in S103. Specifically, in a case where the abnormal physical quantity is humidity measured by humidity measurement unit 20*b*, measured value VA of humidity at a predetermined timing within monitoring time T is stored as a feature of the measured value. The predetermined timing within monitoring time T may be, for example, a start timing of monitoring time T, or a timing after a lapse of a predetermined time from the start of monitoring time T.

Next, in S105, control unit 60 updates the processing program (program update step) and stores the post-update processing program (post-update program). The processing program is updated so that control unit 60 detects the appearance of the feature stored in S104 in the abnormal physical quantity specified in S103 as a fluctuation factor during execution of the post-update processing program, and the driving current is corrected to reduce the difference between the measured value of the laser output power of laser beam LB6 and the target value as compared with when the output fluctuation occurs in S101 at a predetermined time after detection of the fluctuation factor. The driving current is corrected by correcting the command current value so as to lower the laser output power by an amount corresponding to the difference (threshold TH) between the laser output power of laser beam LB6 and the target value at the time of output fluctuation. Specifically, in a case where the abnormal physical quantity is humidity measured by humidity measurement unit 20*b*, the humidity reaching measured value VA is detected as a fluctuation factor.

Accordingly, when a fluctuation factor occurs during execution of the post-update processing program, the driving current is corrected, so that the difference between the laser output power of laser beam LB6 and the target value is reduced as compared with when the output fluctuation is detected during execution of the pre-update processing program, and thus, it is possible to suppress a decrease in processing accuracy due to the output fluctuation.

Moreover, by replacing the pre-update processing program with the post-update processing program and repeating the operations of S101 to S105, the failure rate of workpiece W to be processed by execution of the processing program in S101 can be gradually reduced.

Moreover, since the humidity is specified as an abnormal physical quantity in a case where the humidity does not fall within a predetermined numerical range, it is possible to suppress output fluctuation of the laser output power due to humidity fluctuation. For example, it is possible to suppress a decrease in the laser output power due to an increase in the concentration of water molecules or volatile organic substances in the optical path from decreasing the dust collection performance of a dust collector filter and causing a further decrease in the laser output power.

Moreover, since the loss amount in transmission fiber 50 is specified as an abnormal physical quantity in a case where the loss amount does not fall within a predetermined numerical range, it is possible to suppress output fluctuation of the laser output power due to fluctuation of the loss amount in transmission fiber 50.

Note that, although a plurality of laser devices 20 is provided in laser oscillator 10 in the above exemplary embodiment, only one laser device may be provided. In such a case, laser beam LB2 output from laser device 20 is made directly incident on transmission fiber 50.

Moreover, although the number of laser modules 30 and laser diode bars 31 included in one laser device 20 is set to 10 in the above exemplary embodiment, the number may be set to another number according to the maximum output required for laser device 20, the price of laser device 20, or the like.

Moreover, although the number of emitters 31b included in one laser diode bar 31 is set to 50 in the above exemplary embodiment, the number may be set to another number according to the maximum output required for laser module 30, the price of laser diode bar 31, or the like.

Moreover, although the abnormal physical quantity is specified from the measured values of temperature measurement units 12b, 13b, and 20a, thermocouple 36, and humidity measurement units 12c, 13c, and 20b, and the loss amount of transmission fiber 50 in the above exemplary embodiment, the abnormal physical quantity may be specified from the voltage value and the current value of each unit in laser processing device 100, or the loss amount of the laser beam in a portion other than transmission fiber 50 in laser processing device 100.

Moreover, although the processing program is updated so that the driving current correction process is performed after detection of the fluctuation factor during execution of the post-update processing program in S105 in the above exemplary embodiment, the processing program may be updated so that a warning process of outputting and displaying a warning on display device 80 is performed instead of the correction process. Moreover, the processing program may be updated so that the warning process is performed in addition to the correction process. As a result, the user can stop the processing operation according to the warning process after the fluctuation factor occurs during execution of the post-update processing program.

Moreover, although control unit 60 stores measured value VA as the feature of the measured value of humidity within monitoring time T in S104 in the above exemplary embodiment, the slope of the measured value of humidity within monitoring time T may be stored. Then, in S105, a change in humidity at the slope stored in S104 may be detected as a fluctuation factor.

INDUSTRIAL APPLICABILITY

The present disclosure is useful as a laser output power control method and a laser processing device that control a driving current to be supplied to a laser oscillator so as to bring a laser output power of a laser beam emitted by a laser oscillator close to a target value.

REFERENCE MARKS IN THE DRAWINGS 100 laser processing device
10 laser oscillator
20 laser device
12a, 13a, 24 photodiode
40a photodiode (output measurement unit)
60 control unit
80 display device (output device)
TH threshold
T monitoring time
t1 output fluctuation occurrence timing

The invention claimed is:

1. A laser output power control method to be executed by a control unit in a laser processing device, the device including:
a laser oscillator;
an output measurement unit that measures a light amount of a laser beam emitted by the laser oscillator; and
the control unit that performs feedback control on a driving current to be supplied to the laser oscillator based on a measured value of the output measurement unit to bring a laser output power of the laser beam close to a target value,
the laser output power control method executing:
a first execution step of executing a pre-update program to set the target value to a value defined by the pre-update program and performing the feedback control;
a detection step of detecting an output fluctuation in which a difference between the laser output power and the target value during execution of the first execution step exceeds a predetermined threshold;
a specification step of specifying a physical quantity for which a measured value within a predetermined monitoring time before an occurrence timing of the output fluctuation detected in the detection step does not satisfy a predetermined condition as an abnormal physical quantity from a plurality of physical quantities measured in the laser processing device during execution of the first execution step; and
a program update step of detecting appearance of a predetermined feature in an abnormal physical quantity specified in the specification step as a fluctuation factor during execution of a post-update program, and updating the pre-update program to the post-update program to perform, after detection of the fluctuation factor, at least one of a correction process of correcting the driving current to reduce a difference between the laser output power and the target value as compared with when the output fluctuation occurs in the first execution step or a warning process of causing an output device to output a warning.

2. The laser output power control method according to claim 1, wherein the predetermined condition is falling within a predetermined numerical range.

3. The laser output power control method according to claim 1, wherein the predetermined feature is that the abnormal physical quantity is a measured value at a predetermined timing within the monitoring time.

4. The laser output power control method according to claim 1, wherein the plurality of physical quantities includes humidity.

5. A laser processing device comprising:
a laser oscillator;
an output measurement unit that measures a light amount of a laser beam emitted by the laser oscillator; and
a control unit that performs feedback control on a driving current to be supplied to the laser oscillator based on a measured value of the output measurement unit to bring a laser output power of the laser beam close to a target value,
wherein the control unit is configured to execute:
a first execution step of executing a pre-update program to set the target value to a value defined by the pre-update program and performing the feedback control;
a detection step of detecting an output fluctuation in which a difference between the laser output power and the target value during execution of the first execution step exceeds a predetermined threshold;
a specification step of specifying a physical quantity for which a measured value within a predetermined monitoring time before an occurrence timing of the output fluctuation detected in the detection step does not satisfy a predetermined condition as an abnormal physical quantity from a plurality of physical quantities measured in the laser processing device during execution of the first execution step; and a program update step of detecting appearance of a predetermined feature in an abnormal physical quantity specified in the specification step as a fluctuation factor during execution of a post-update program, and updating the pre-update program to the post-update program to perform, after detection of the fluctuation factor, at least one of a correction process of correcting the driving current to reduce a difference between the laser output power and the target value as compared with when the output fluctuation occurs in the first execution step or a warning process of causing an output device to output a warning.

\* \* \* \* \*